(12) United States Patent
Chang et al.

(10) Patent No.: US 7,332,370 B2
(45) Date of Patent: Feb. 19, 2008

(54) METHOD OF MANUFACTURING A PHASE CHANGE RAM DEVICE UTILIZING REDUCED PHASE CHANGE CURRENT

(75) Inventors: Heon Yong Chang, Kyoungki-do (KR); Hae Chan Park, Seoul (KR); Suk Kyoung Hong, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 301 days.

(21) Appl. No.: 11/254,472

(22) Filed: Oct. 20, 2005

(65) Prior Publication Data
US 2006/0281216 A1 Dec. 14, 2006

(30) Foreign Application Priority Data
Jun. 10, 2005 (KR) .................. 10-2005-0049780

(51) Int. Cl.
*H01L 21/06* (2006.01)
(52) U.S. Cl. .................. 438/102; 438/3; 438/95; 257/2; 257/246
(58) Field of Classification Search ............ 438/3, 438/102, 103, 197, 210, 311, 381, 382, 672; 257/2, 3, 4, 62, 246
See application file for complete search history.

(56) References Cited

U.S. PATENT DOCUMENTS 6,358,813 B1 * 3/2002 Holmes et al. ............ 438/398
7,045,851 B2 * 5/2006 Black et al. ................ 257/315
2004/0256662 A1 12/2004 Black et al.
2005/0130414 A1 * 6/2005 Choi et al. ................. 438/672

FOREIGN PATENT DOCUMENTS

| KR | 1020050011059 | 1/2005 |
| KR | 1020050031160 | 4/2005 |
| KR | 1020050033312 | 4/2005 |

OTHER PUBLICATIONS

Guarini et al., "Nanoscale Patterning using Self-Assembled Polymers for Semiconductor Applications," J. Vac. Sci. Technol. B 19(6), Nov./Dec. 2001.*

(Continued)

*Primary Examiner*—Kiesha L. Rose
*Assistant Examiner*—Daniel Whalen
(74) *Attorney, Agent, or Firm*—Ladas & Parry LLP

(57) ABSTRACT

To effectively lower the current required for changing a phase of a phase change layer in a phase change RAM device, metal pads are formed on a semiconductor substrate, and an oxide layer is formed on the metal pads. Nano-sized copolymer patterns aligned with the metal pads covered by the oxide layer are formed on the oxide layer. The oxide layer is etched to form oxide layer patterns by using the nano-sized copolymer patterns as barrier. The nano-sized copolymer patterns are then removed. A nitride layer is deposited and then etched to expose the oxide layer patterns. The exposed oxide layer patterns are removed to form nano-sized holes exposing the metal pads. Bottom electrodes are then formed in the nano-sized holes. A phase change layer and a top electrode are formed on each of the bottom electrodes.

9 Claims, 4 Drawing Sheets

OTHER PUBLICATIONS

Black et al., "Integration of Self-Assembled Diblock Copolymers for Semiconductor Capacitor Fabrication," 2001 American Institute of Physics.*

Fata et al., "Nano-patterning of GST Thin Films by Self-assembled Di-block Copolymers Lithography," Mater. Res. Soc. Symp. Proc. vol. 997, 2007 Materials Research Society.*

* cited by examiner

METHOD OF MANUFACTURING A PHASE CHANGE RAM DEVICE UTILIZING REDUCED PHASE CHANGE CURRENT

BACKGROUND OF THE INVENTION

1. Field of the invention

The present invention relates generally to a method of manufacturing a phase change RAM device. More particularly, the present invention relates to a method of manufacturing a phase change RAM device capable of effectively lowering the level of current required for changing a phase of a phase change layer.

2. Description of the Prior Art

In general, the memory devices are mainly classified as (1) random access memory (RAM) devices, which are volatile memory devices that lose information stored therein when power is shut off, and (2) read only memory (ROM) devices, which are non-volatile memory device that retain stored information even if power is shut off. Volatile RAM devices include DRAMs and SRAMs, and non-volatile ROM devices include flash memories, such as an electrically erasable and programmable ROM (EEPROM).

However, although DRAM devices are generally known in the art to be superior memory devices, they require a high charge storage capability. For this reason, the DRAM devices must increase the surface area of an electrode, and this requirement does not help high integration design of the DRAM devices.

The flash memories include two gates aligned in a stacked structure, and they require an operating voltage that is higher than the power supply voltage. For this reason, the flash memories require separate boost circuit to generate the suitable voltage needed for writing and erasing operations. This also does not help to achieve the high integration design of flash memories.

These days, studies and researches on new types of memory devices having both the characteristics of the non-volatile memory devices and the capability of obtaining high integration with relatively simple structure have been carried out. An outcome of such studies points to the phase change RAM devices.

In a phase change RAM device, the phase of a phase change layer interposed between top and bottom electrodes is changed from a crystalline state to an amorphous state by applying the current between the top and bottom electrodes. The phase change RAM device reads out information stored in a cell based on variation of resistance between the crystalline state and the amorphous state.

A phase change RAM device employs a chalcogenide layer as a phase change layer. The chalcogenide layer includes the compound consisting of Ge, Sb and Te, and the phase of the chalcogenide layer is changed between the amorphous state and the crystalline state caused by joule heat of the current applied to the chalcogenide layer. Based on the fact that specific resistance of the phase change layer having the amorphous state is higher than that of the phase change layer having the crystalline state, the current flowing through the phase change layer is detected in the write and read modes, thereby determining if information stored in the phase change memory cell is logic "1" or logic "0".

FIG. 1 is a cross-sectional view showing a conventional phase change RAM device.

As shown in FIG. 1, gates 4 are formed on an active area of a semiconductor substrate 1 defined by an isolation layer (not shown). In addition, a junction area (not shown) is formed at both sides of gates 4 on the upper surface of the semiconductor substrate 1.

An interlayer insulating film 5 is formed on the entire surface of the semiconductor substrate 1 such that the gates 4 are covered with the interlayer insulating film 5. A first tungsten plug 6a is formed on a first predetermined area of the interlayer insulating film 5 where the phase change cell is formed later and a second tungsten plug 6b is formed on a second predetermined area of the interlayer insulating film 5 to which the ground voltage (Vss) is applied later.

A first oxide layer 7 is formed on the interlayer insulating film 5 including the first and second tungsten plugs 6a and 6b. Although not illustrated in detail, a dot type metal pad 8 is formed on the first predetermined area of the interlayer insulating film 5, in which the phase change cell is formed later, such that the dot type metal pad 8 can make contact with the first tungsten plug 6a and a bar type ground line (i.e., a Vss line) 9 is formed on the second predetermined area of interlayer insulating film 5, to which the Vss voltage is applied, in such a manner that the bar type ground line 9 can make contact with the second tungsten plug 6b.

A second oxide layer 10 is formed on the first oxide layer 7 including the dot type metal pad 8 and the bar type ground line 9. In addition, a bottom electrode 11 in the form of a plug is formed in a predetermined area of the second oxide layer 10, on which the phase change cell is to be formed, in such a manner that the bottom electrode 11 can make contact with the dot type metal pad 8.

In addition, a phase change layer 12 and a top electrode 13 are stacked on the second oxide layer 10 in the form of a pattern in such a manner that the top electrode 13 makes contact with the bottom electrode 11. Thus, the phase change cell consisting of the plug type bottom electrode 11, the phase change layer 12 stacked on the bottom electrode 11, and the top electrode 13 stacked on the phase change layer 12 is obtained.

A third oxide layer 14 is formed on the second oxide layer 10 such that the phase change cell is covered with the third oxide layer 14, and a metal wiring 15 is formed on the third oxide layer 14 such that the metal wiring 15 makes contact with the top electrode 13.

In order to change the phase of the phase change layer 12 in a prior art phase change RAM device having, for example, the above structure, a relatively high current flow above 1 mA is required. Thus, it is necessary to lower the current required for changing the phase of the phase change layer 12 by reducing the contact area between the phase change layer 12 and the electrode. For this reason, the plug type bottom electrode 11 is conventionally fabricated in a size less than 100 nm through an electron-beam (E-beam) process.

However, because the E-beam process is unstable, the bottom electrode 11 fabricated through the E-beam process cannot be uniformly formed throughout the predetermined area of the semiconductor substrate. When the contact area between the bottom electrode 11 and the phase change layer 12 cannot be evenly formed over the entire predetermined area of the semiconductor substrate, an increased current is required to the phase change layer such as during a write mode.

Thus, there are limitations in the conventional phase change RAM devices to reducing the contact area between the phase change layer and the bottom electrode, making these conventional devices difficult to lower the current required for changing the phase of the phase change layer.

SUMMARY OF THE INVENTION

Accordingly, the present invention has been made to solve the above-mentioned problems occurring in the prior art, and an object of the present invention is to provide a method of manufacturing a phase change RAM device capable of effectively lowering the current required for changing a phase of a phase change layer.

In order to accomplish the above object, according to the present invention, there is provided a method of manufacturing a phase change RAM device, the method comprising the steps of: forming a plurality of metal pads on a semiconductor substrate with an under layer formed thereon; forming an oxide layer on the semiconductor substrate such that the metal pads are covered with the oxide layer; forming a nano-sized copolymer pattern including diblock copolymer on the oxide layer; etching the oxide layer by using the nano-sized copolymer pattern as an etching barrier; removing the nano-sized copolymer pattern; depositing a nitride layer on an entire surface of a resultant substrate; etching the nitride layer such that the oxide layer is exposed; forming a plurality of nano-sized holes for exposing the metal pads by removing the exposed oxide layer; filling the nano-sized holes with a conductive layer, thereby forming a plurality of plug type bottom electrodes having a nano-size; and sequentially forming a phase change layer and a top electrode on the plug type bottom electrode.

According to the preferred embodiment of the present invention, the diblock copolymer consists of polystyrene and polymethyl methacrylate.

The oxide layer is etched by using $CHF_3$ and Ar gas.

The nitride layer is deposited through performing a chemical vapor deposition process or an atomic layer deposition process.

The nitride layer is etched through performing a reaction ion etching process using $CHF_3$, $CF_4$, $CH_2F_6$ and Ar gas.

The oxide layer is removed by performing a wet etching process using a dilute HF solution.

The bottom electrode includes one selected from the group consisting of TiN, TiW, Al, Cu and WSi.

The phase change layer includes one selected from the group consisting of Ge—Sb—Te, Ge—Bi—Te, Sb—Te doped with at least one of Ag, In and Bi, and Bi—Te doped with at least one of Ag, In and Sn.

The top electrode includes one selected from the group consisting of Al, Ti, Ta, TaSiN, TaN, Ru, TiW and TiAlN.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, the present invention will be described with reference to accompanying drawings.

FIGS. 2A to 2I are the cross-sectional views for illustrating the procedures of manufacturing a phase change RAM device according to an embodiment of the present invention.

Figure 1:
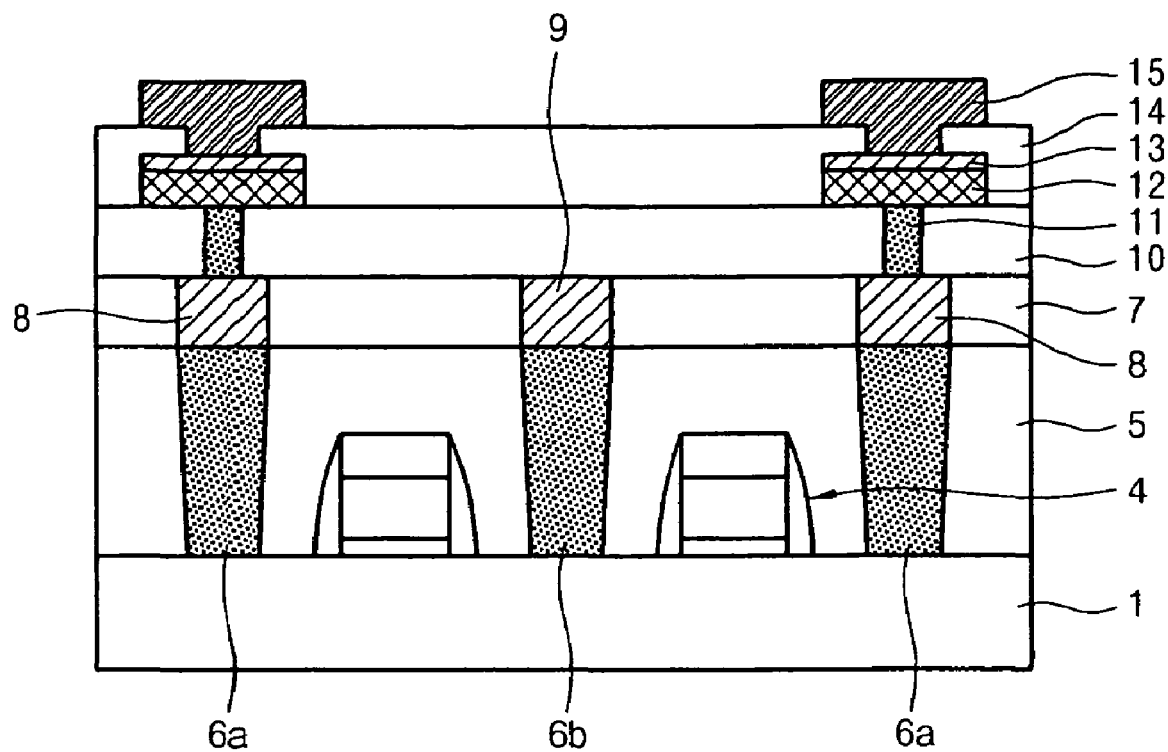
FIG. 1 is a cross-sectional view for illustrating a conventional phase change RAM device.
Figure 2A:
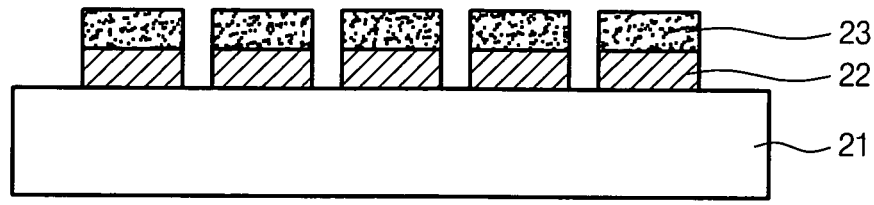
FIGS. 2A to 2I are cross-sectional views for illustrating the manufacturing procedures of a phase change RAM device according to an embodiment of the present invention.

Referring to FIG. 2A, a plurality of metal pads 22 are formed on the semiconductor substrate 21 by etching a metal layer deposited on the semiconductor substrate 21 using a plurality of mask patterns 23. More specifically, after preparing the semiconductor substrate 21 with an under layer (not shown) including a gate, a tungsten plug, and an interlayer insulating film formed thereon, the metal layer is deposited on the semiconductor substrate 21. After that, the mask patterns 23 are formed on the metal layer, and then the metal layer is etched by using the mask patterns 23, forming a plurality of metal pads 22.

Figure 2B:
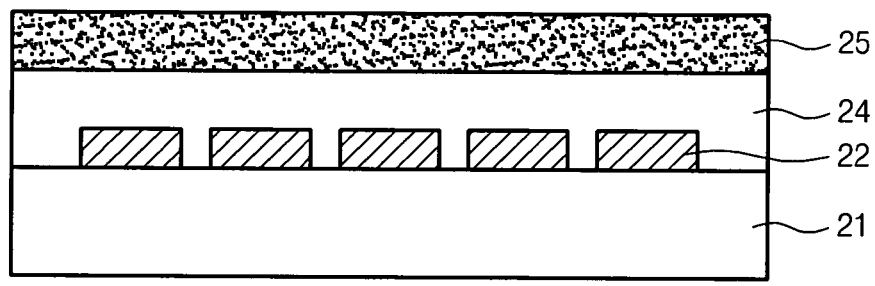

Referring to FIG. 2B, after removing the mask 23, an oxide layer 24 is formed on the entire surface of the semiconductor substrate 21 having the metal pads 22. Then, a chemical mechanical polishing (CMP) process is performed on the oxide layer 24 to planarize the surface of the oxide layer 24 in order to form the oxide layer 24 evenly at a uniform thickness on the metal pads 22.

Still referring to FIG. 2B, a diblock copolymer layer 25 made of materials including at least polystyrene and polymethyl methacrylate (PMMA) is coated on the oxide layer 24. After that, the PMMA is removed from the diblock copolymer layer 25 by using an organic solvent, thereby forming a plurality of nano-sized copolymer patterns 25a (shown in FIG. 2C) on the oxide layer 24 as shown in FIG. 2B.

Figure 2C:
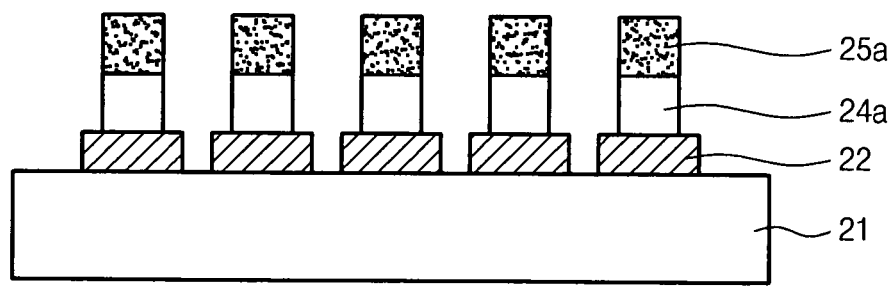

Then, using the nano-sized copolymer patterns 25a (as shown in FIG. 2C) as an etching barrier, the oxide layer 24 shown in FIG. 2B is etched by using $CHF_3$ and Ar gas to form nano-sized oxide layer patterns 24a as shown in FIG. 2C. Since the oxide layer 24 (FIG. 2B) is etched by using the nano-sized copolymer patterns 25a (FIG. 2C) as an etching barrier, the oxide layer patterns 24a (FIG. 2C) are also nano-sized. Due to the nano-sized nature of the oxide layer patterns 24a, a plurality of plug-type bottom electrodes, each nano-sized, can be stably formed in the following process (es), which are described in more detail below.

Figure 2D:
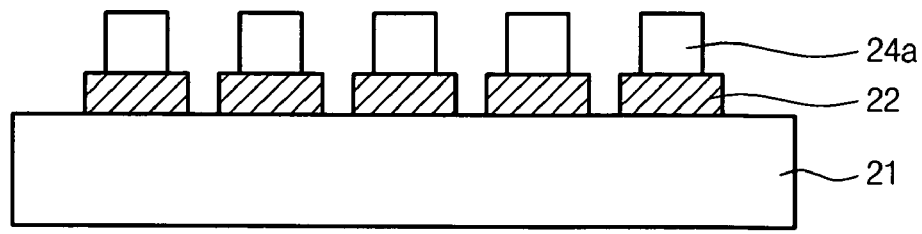

Referring to FIG. 2D, an oxygen plasma process is performed with respect to the resultant substrate, and this removes the nano-sized copolymer patterns 25a remaining on the resultant substrate.

Figure 2E:
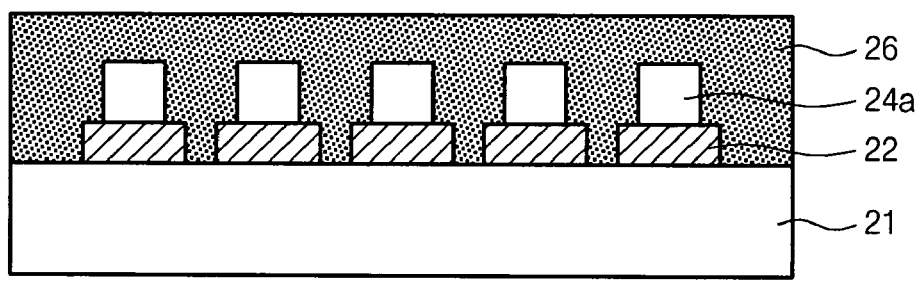

Referring to FIG. 2E, after removing the nano-sized copolymer patterns 25a, a nitride layer 26 is deposited on the entire surface of the resultant substrate through a chemical vapor deposition (CVD) process or an atomic layer deposition (ALD) process such that the oxide layer patterns 24a are completely covered by the nitride layer 26.

Figure 2F:
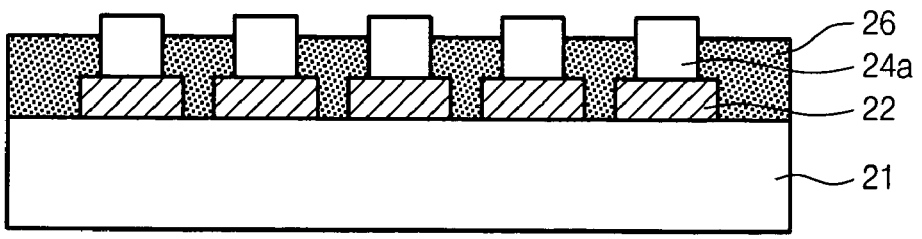

Referring to FIG. 2F, an anisotropic reaction ion etching (RIE) process is performed with respect to the nitride layer 26 such that the oxide layer patterns 24a are exposed. The anisotropic RIE process is performed with all or one or more of $CHF_3$, $CF_4$, $CH_2F_6$, and Ar gases. Preferably, the upper lateral portion of the oxide layer patterns 24a is exposed together with the upper surface of the oxide layer patterns 24a through the anisotropic RIE process.

Figure 2G:
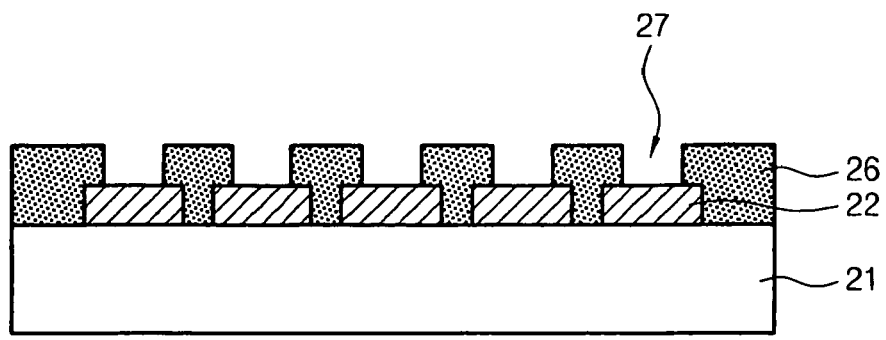

Referring to FIG. 2G, the exposed oxide layer patterns 24a are removed by a wet etching process using a dilute hydrofluoric acid (HF) solution. Nano-dots, that is, nano-sized holes 27, are then formed in the nitride layer 26 exposing the metal pads 22 as shown in FIG. 2G. Since the nano-sized holes 27 are formed by removing the nano-sized oxide layer patterns 24a, the nano-sized holes 27 are formed with a uniform nano-size over the whole area of the semiconductor substrate. This means that the plug-type bottom electrodes can also be formed with a uniform nano-size through the following processes.

Figure 2H:
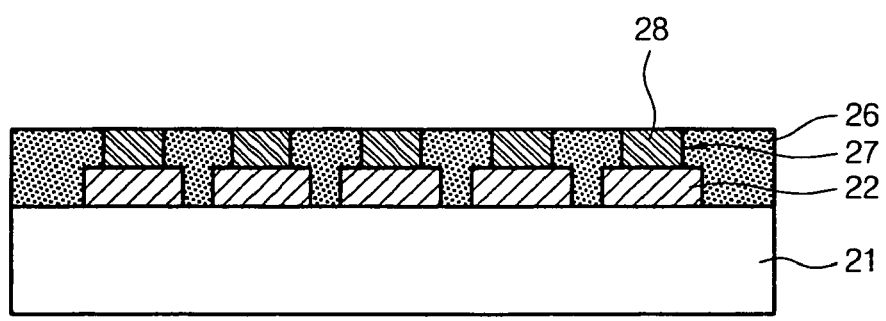

Referring to FIG. 2H, a bottom electrode material is deposited on the nitride layer 26 such that the nano-sized holes 27 are filled with the bottom electrode material. Herein, the bottom electrode material is one selected from the group consisting of TiN, TiW, Al, Cu and WSi. Then, the bottom electrode material is subject to an etch-back process or a CMP process such that the nitride layer 26 is exposed, thereby forming plug type bottom electrodes 28 in the nano-sized holes 27.

Since each bottom electrode 28 is formed with a uniform size in the nano-sized holes 27, the bottom electrodes 28 having the uniform size can be distributed over the entire predetermined area of the semiconductor substrate 21.

Figure 2I:
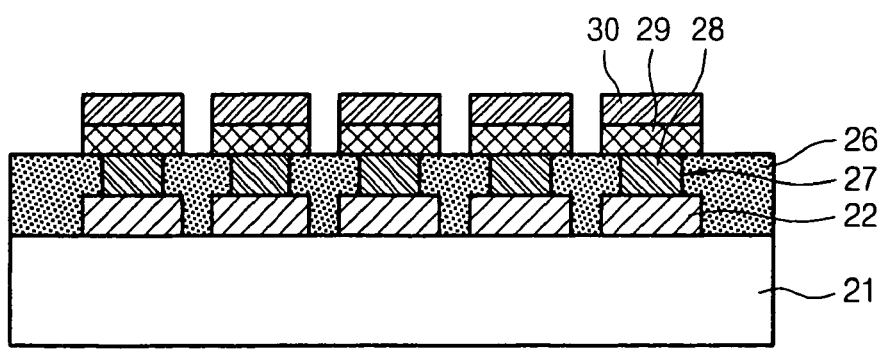

Referring to FIG. 2I, a phase change layer 29 and a top electrode material are sequentially formed on the nitride layer 26 including the bottom electrodes 28. The phase change layer 29 includes one of: Ge—Sb—Te; Ge—Bi—Te; Sb—Te doped with at least one of Ag, In and Bi; and Bi—Te doped with at least one of Ag, In and Sn. In addition, the top electrode material includes one of Al, Ti, Ta, TaSiN, TaN, Ru, TiW and TiAlN.

Then, after forming top electrodes 30 by etching the upper electrode material, the phase change layer 29 is etched, thereby forming a phase change cell having a stacked structure of the plug type bottom electrode 28, the phase change layer 29 and the top electrode 30.

After that, the additional fabrication processes are sequentially performed to fabricate the phase change RAM device according to the present invention.

As described above, since the plug type bottom electrodes 28 are nano-sized, the contact area between each bottom electrode 28 and each corresponding phase change layer 29 is reduced as compared with that of the prior art, lowering the level of current required for changing the phase of the phase change layer 29.

As described above, the present invention can provide a plurality of uniformly nano-sized, plug-type bottom electrodes 28 by utilizing diblock copolymer, among others, so that the contact area between each of the bottom electrodes 28 and the corresponding phase change layer 29 can be reduced. This would lower the level of writing current required for changing the phase of the phase change layer.

In addition, the present invention can form the bottom electrodes 28 having the uniform size over the whole area of the semiconductor substrate, so that the writing current range in the chip can be reduced.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of manufacturing a phase change RAM device, the method comprising the steps of:
    i) forming a plurality of metal pads on a semiconductor substrate;
    ii) forming an oxide layer on the semiconductor substrate covering the metal pads formed on the semiconductor substrate;
    iii) forming a plurality of nano-sized copolymer patterns, each having diblock copolymer, on the oxide layer such that each nano-sized copolymer pattern is aligned above one of the metal pads;
    iv) etching the oxide layer by using the nano-sized copolymer patterns as an etching barrier thus forming a plurality of oxide layer patterns;
    v) removing the nano-sized copolymer patterns;
    vi) depositing a nitride layer on the resultant semiconductor substrate covering the metal pads and the oxide layer patterns;
    vii) etching the nitride layer exposing at least the top surface of each of the oxide layer patterns;
    viii) removing the oxide layer patterns to form a plurality of nano-sized holes exposing the metal pads through the nano-sized holes;
    ix) filling the nano-sized holes with a conductive material to form a plurality of nano-sized plug type bottom electrodes; and
    x) forming a phase change layer on each of the plug type bottom electrodes and a top electrode on the phase change layer.

2. The method of claim 1, wherein the diblock copolymer consists of polystyrene and polymethyl Methacrylate.

3. The method of claim 1, wherein the oxide layer is etched by using $CHF_3$ and Ar gas.

4. The method of claim 1, wherein the nitride layer is deposited through a chemical vapor deposition process or an atomic layer deposition process.

5. The method of claim 1, wherein the nitride layer is etched through performing a reaction ion etching process using $CHF_3$, $CF_4$, $CH_2F_6$ and Ar gas.

6. The method of claim 1, wherein the oxide layer is removed by a wet etching process using a diluted HF solution.

7. The method of claim 1, wherein the bottom electrode is made from one of TiN, TiW, Al, Cu and WSi.

8. The method of claim 1, wherein the phase change layer is made from one of: Ge—Sb—Te; Ge—Bi—Te; Sb—Te doped with at least one of Ag, In, and Bi; and Bi—Te doped with at least one of Ag, In and Sn.

9. The method of claim 1, wherein the top electrode is made from one of Al, Ti, Ta, TaSiN, TaN, Ru, TiW, and TiAlN.

* * * * *